(12) United States Patent
Reimann et al.

(10) Patent No.: US 9,190,237 B1
(45) Date of Patent: Nov. 17, 2015

(54) ELECTRODE COATING FOR ELECTRON EMISSION DEVICES WITHIN CAVITIES

(71) Applicant: NXP B.V., Eindhoven (NL)

(72) Inventors: Klaus Reimann, Eindhoven (NL); Olaf Wunnicke, Eindhoven (NL); Michael in 't Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/261,246

(22) Filed: Apr. 24, 2014

(51) Int. Cl.
*H01J 9/00* (2006.01)
*H01J 9/12* (2006.01)
*H01J 9/02* (2006.01)
*H01L 27/02* (2006.01)

(52) U.S. Cl.
CPC ............. *H01J 9/025* (2013.01); *H01L 27/0248* (2013.01)

(58) Field of Classification Search
USPC .......................................................... 445/51
See application file for complete search history.

(56) References Cited

U.S. PATENT DOCUMENTS

| 4,855,636 A | 8/1989 | Busta et al. |
|---|---|---|
| 5,229,331 A | 7/1993 | Doan et al. |
| 5,278,450 A | 1/1994 | Wolters et al. |
| 5,627,427 A | 5/1997 | Das et al. |
| 6,004,830 A | 12/1999 | Potter |
| 2004/0245910 A1* | 12/2004 | Tang et al. ............... 313/483 |
| 2010/0136869 A1* | 6/2010 | Aoki et al. ................ 445/24 |
| 2012/0007490 A1* | 1/2012 | Liu et al. ................. 313/306 |

FOREIGN PATENT DOCUMENTS

| DE | 4112436 A1 | 11/1992 |
|---|---|---|
| DE | 4421256 A1 | 1/1995 |
| EP | 0570211 A1 | 5/1993 |
| EP | 2 557 406 A1 | 2/2013 |

OTHER PUBLICATIONS

Bock, K. "ESD Issues in Compound Semiconductor High-Frequency Devices and Circuits." EOS/ESD Symposium 97; pp. 1-12; 1997.
Van Der Putten, A.M.T. "The Filling of Contact Holes Using Electroless Metal Deposition" Internal Philips Report Nat Lab Report 6338, pp. 1-46; 1989.
Extended European Search Report for EP Patent Appln. No. 15161025.0 (Sep. 10, 2015).

* cited by examiner

*Primary Examiner* — Asok K Sarkar (57) ABSTRACT

Embodiments of a method for forming a field emission diode for an electrostatic discharge device include forming a first electrode, a sacrificial layer, and a second electrode. The sacrificial layer separates the first and second electrodes. The method further includes forming a cavity between the first and second electrode by removing the sacrificial layer. The cavity separates the first and second electrodes. The method further includes depositing an electron emission material on at least one of the first and second electrodes through at least one access hole after formation of the first and second electrodes. The access hole is located remotely from a location of electron emission on the first and second electrode.

18 Claims, 4 Drawing Sheets

ELECTRODE COATING FOR ELECTRON EMISSION DEVICES WITHIN CAVITIES

Electrostatic discharge is the transfer of electricity between two electrically charged objects at different electrostatic potentials and is an issue in the reliability and durability of solid-state electronics. Electrostatic discharge can be induced by an electrostatic field or caused by electrical breakdown, an electrical short, or just by contact. It is important in many applications to protect from electrostatic discharge as it may be very damaging. Electrostatic discharge can permanently damage expensive integrated circuits. Therefore, protection from electrostatic discharge is needed through Electrostatic discharge protection devices. This is especially true for faster and smaller computers and devices that require smaller and newer circuits. Electrostatic discharge can wipe out faster semiconductor chips.

A common problem of vacuum and quasi-vacuum electron devices is the emission of electrons into the cavity, known as field emission or field electron emission. Field electron emission is induced by an electrostatic field and commonly occurs from a solid surface into a vacuum. Field electron emission is especially sensitive to the surface layers material properties. Using pure silicon as an electron emission electrode can be severely hampered by the forming of surface layers such as a native oxide. Thin films of silicon dioxide or silica grow on silicon surface via thermal oxidation. The native oxide is used as an insulator in many beneficial applications. However, the native oxide is detrimental in the use of field emission diodes. One solution is the use of gallium arsenide (GaAs) as electron emission electrodes to overcome the defects of a native oxide on the surface layer. However, gallium arsenide is less abundant and more expensive to process, whereas silicon is highly abundant. Additionally, the economy of scale further benefits the use of silicon as silicon is used in so many semiconductor applications. Another solution involves layering a coating on a cathode by sputtering or other techniques. However, the coating occurs before formation or placement of the anode on the device. The extra processing steps, which may involve bonding separate wafers, can destroy or damage the emission layer of the cathode, which is typically sensitive. Additionally, the extra process steps can be costly and time consuming.

Embodiments of a method for forming a field emission diode for an electrostatic discharge device are disclosed. The method includes forming a first electrode, a sacrificial layer, and a second electrode. The sacrificial layer separates the first and second electrodes. The method further includes forming a cavity between the first and second electrode by removing the sacrificial layer. The cavity separates the first and second electrodes. The method further includes depositing an electron emission material on at least one of the first and second electrodes through one or more access holes after formation of the first and second electrodes. The access holes are located remotely from a location of electron emission on the first or second electrode.

Depositing an electron emission material after formation of the first and second electrode and after formation of the cavity eliminate costly and damaging process steps, such as bonding of separate wafers. In some embodiments, the electron emission material can be a conductive material, a thin isolating or semiconducting material through which the electrons can easily tunnel, or a nanostructure combination of the before mentioned materials. In some embodiments, the electron emission material preferably has a low work-function. The electron emission material may protect the electrode by eliminating and not producing an insulating oxide on the surface of the electrode. For example, silicon oxide can severely hinder an electron emission electrode by creating an insulating layer.

In some embodiments, either electrode or both are etched to remove oxide from the surface(s) of the electrode(s). For example, etching of the surface of a silicon electrode will remove silicon oxide from the surface of the electrode. In an embodiment, the electron emission material is palladium. Use of palladium as the electron emission material may be beneficial for its compatibility with standard industry processes. In some embodiments, the electron emission material may be a conductive material with a low work function, e.g., below 4 eV. The deposition of an electron emission material or materials allows for the formation of a stable, clean, and oxide free surface on the electrode leading to a more reliable product.

The first and second electrodes may be a single material or a combination of materials. In an embodiment, the first and second electrodes may be different materials. In an embodiment, the first and second electrodes are silicon. The electrodes may any material suitable for deposition of the electron emission material. The material may be but is not limited to SiGe, SiC, GaAs, silicides, metals, or other materials. In some embodiments, the first electrode is an emission electrode. In some embodiments, the second electrode is an emission electrode. In some embodiments, the first and second electrodes are emission electrodes.

In some embodiments, the electron emission material is deposited selectively on the surface of the first and second electrodes. In some embodiments, the electron emission material is deposited selectively only on the surface of the first electrode or the second electrode. In some embodiments, only a portion of the surface of either or both electrodes is covered with the electron emission material. In some embodiments, clusters of the electron emission material are deposited on the surface of either or both electrodes. In some embodiments, the conductive material is deposited with selective electroless deposition on the surface of at least one of the electrodes. In some embodiments, the conductive material is selectively coated by electrolytic deposition after formation of the cavity. In some embodiments, the silicon surface of the electrode is modified by forming a thin alloy or metal clusters on the surface of the electrode. In some embodiments, the deposition may occur by chemical vapor deposition.

In some embodiments, the deposition of the electron emission material occurs through at least one access hole. The shape, size, number, and location of the access holes may vary. In some embodiments, an access hole is located remotely from a location of electron emission on the first and second electrode. An access hole is located remotely where the access hole is not in alignment with a location of electron emission on the first or second electrode. In some embodiments, an access hole is located at a side of the device. In some embodiments, the access hole is located in a center of the device. In some embodiments, the access hole is located in the top electrode. In some embodiments, the access hole is isolated from a surface location of electron emission on either or both the first and second electrode. In some embodiments, the access hole may be a circular hole in the second electrode. Other shapes of the access hole are envisioned. In some embodiments, more than one access hole provides access to the cavity to deposit the electron emission material on the first and/or second electrodes. The number of access holes may be optimized to ensure uniform deposition or reproducible deposition on multiple emission sites. Additionally, the number of access holes may be optimized to ensure fast processing.

In some embodiments, the electrodes are planar. In some embodiments, at least one of the electrodes includes field enhancement structures. The field enhancements structures may be of various shapes and sizes to better regulate the location of electron emission from the electrode. In some embodiments, the field enhancement structures of the electrode are wedges. In some embodiments, the field enhancement structures of the electrode are pyramidal tips. In some embodiments, the field enhancement structures of the electrode are conical in shape. In some embodiments, the field enhancement structures are triangular teeth. Other shapes may be used and are envisioned.

In some embodiments, the entire surface of the electrodes is coated with an electron emission material. In some embodiments, only a portion of the surface of an electrode is coated with an electron emission material. In some embodiments, depositing an electron emission material through an access hole includes only partially covering the surface of the first electrode and forming clusters of the electron emission material on the surface of the first electrode. In some embodiments, only the field enhancement structures are coated with the electron emission material. In some embodiments, only a portion of the field enhancement structures are coated with the conductive material. For example, the conical shaped field enhancement structures may be coated completely. Alternatively, the conical shaped field enhancement structures may be coated only at the tips of the cones. In some embodiments, each field enhancement structure on an electrode may be coated differently.

In some embodiments, the sacrificial layer is predetermining the exact distance between the first and second electrodes. In some embodiments, the cavity is hermetically sealed. In some embodiments, the cavity is a vacuum or quasi-vacuum. In some embodiments, the cavity includes a gas or other similar substance. In some embodiments, the cavity is sealed by plugging the access hole after depositing the electron emission material. In some embodiments, the plugging the access hole forms a low pressure seal of the cavity. In some embodiments, the plugging may occur by sputtering or other such techniques.

Embodiments of an electrostatic discharge protection device for use in an electron device are disclosed. The electrostatic discharge protection device includes a field emission diode. The field emission diode includes a first electrode, a second electrode, and a cavity. The cavity separates the first and second silicon electrodes at a predetermined distance between the first and second silicon electrode. A surface of each silicon electrode is etched, leaving no silicon oxide on the surface of each electrode. The field emission diode further includes an electron emission material on the surface of the first and second electrode, the electron emission material deposited after formation of the first and second electrodes and the cavity.

Embodiments of a method for selectively coating an electrode of a field emission diode are also disclosed. The method includes depositing an electron emission material into a cavity of a formed field emission diode. The electron emission material is deposited on a surface of at least one of a first and second electrode. The depositing occurs through an access hole. The access hole is located remotely from a location of electron emission on the first and second electrode.

Other aspects in accordance with the invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "some embodiments", or similar language means that a particular feature, structure, or characteristic described in connection with the indicated embodiment is included in at least one embodiment of the present invention. Thus, the phrases "in one embodiment", "in an embodiment", "in some embodiments", and similar language throughout this specification may, but do not necessarily, all refer to the same embodiment.

While many embodiments are described herein, at least some of the described embodiments facilitate the use of field emission diodes with silicon electrodes as electrostatic discharge protection devices. Some embodiments facilitate fast reaction and low and constant capacitance and are ideal for a wide range of applications including but not limited to microwave circuits and antenna protection. Some embodiments facilitate the deposition of material on an electrode after formation of a cathode, cavity, and anode. Some embodiments allow the elimination of costly and potentially damaging process steps after deposition of a surface layer on an electrode.

Some embodiments facilitate the use of silicon as electrodes in a field emission diode as opposed to other materials such as gallium arsenide. The use of silicon allows for many advantages over the use of other materials. For example, most factories of semiconductor devices are based on silicon processing. Such factories have extensive knowledge and experience with silicon processing and have optimized silicon processes. Additionally, economies of scale are reached with the use of silicon. Vacuum cavities may be more reliably made with silicon electrodes. If processing is restricted to silicon and its dielectrics, high-temperature deposition steps may be used increasing control in the deposition steps.

Some embodiments enable cavity formation with high temperature layers. Some embodiments allow for better adhesion of the layers that form the cavity. Some embodiments allow for more stable electron field emission than from a native silicon surface. Some embodiments allow for the use of silicon as structural material for the cavity and avoid high temperature steps after the formation of the cavity.

Some embodiments enable the processing of a complete, wafer-level packaged device on a silicon wafer. Some embodiments provide for the deposition of materials on surfaces of electrodes in a cavity. Some embodiments facilitate more reliable electron devices and provide reliable protection from electrostatic discharge.

Figure 1A:
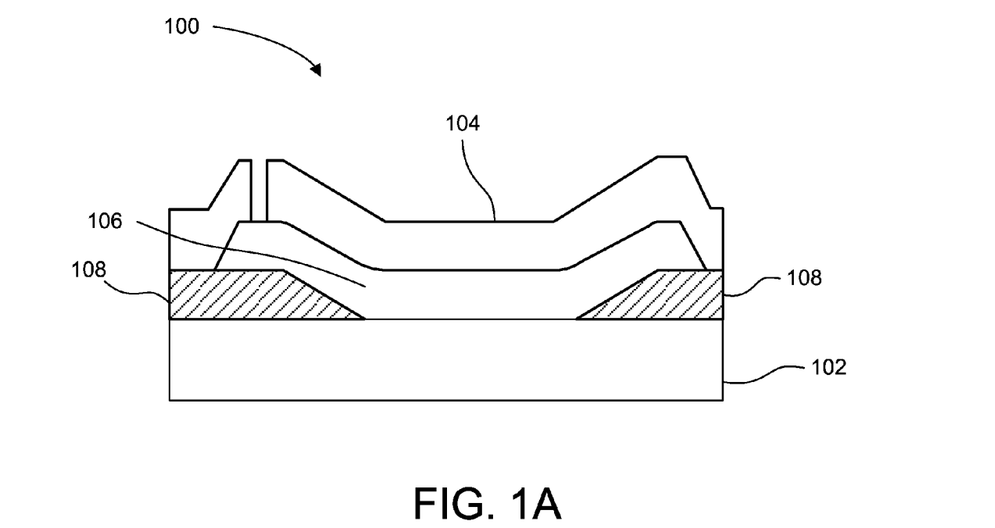
FIG. 1A depicts one embodiment of a planar field emission diode with an access hole.

FIG. 1A depicts one embodiment of a planar field emission diode 100 with an access hole 114. Although the field emission diode 100 is shown and described with certain components and functionality, other embodiments of the field emission diode 100 may include fewer or more components to implement less or more functionality.

Figure 1B:
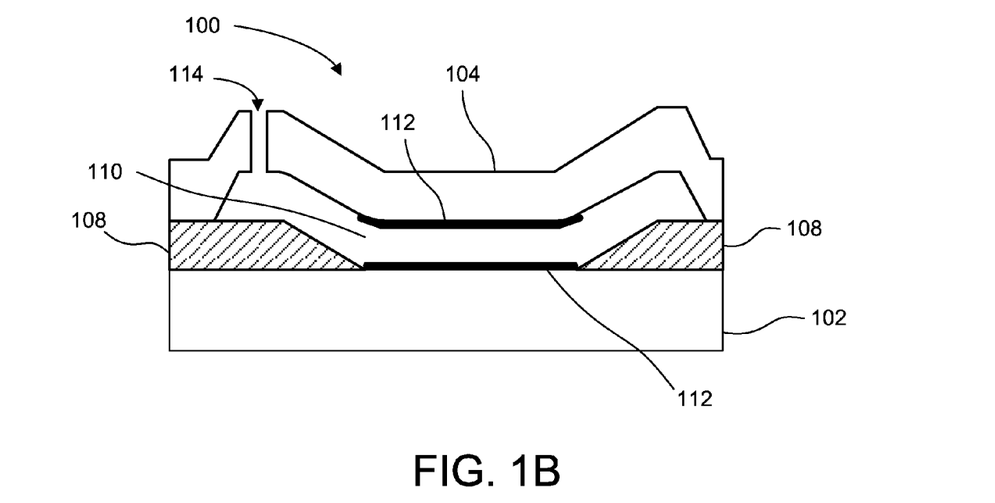
FIG. 1B depicts one embodiment of the planar field emission diode of FIG. 1A with an electron emission coating on the surface of the first and second electrodes.

The illustrated embodiment includes a first electrode 102 and a second electrode 104. The processes for forming a silicon electrode are well known in the field and are not explained in detail within this description, for the sake of brevity. The illustrated embodiment includes a sacrificial layer 106 between the first electrode 102 and the second electrode 104. A cavity is formed between the first silicon electrode 102 and the second silicon electrode 104, as shown in FIG. 1B. The cavity is formed by removing a sacrificial layer 106. For example, the sacrificial layer may be $SiO_2$. In some embodiments, the layers that form the cavity have better adhesion on silicon. Some embodiments enable cavity formation with high temperature layers.

The first electrode 102 and the second electrode 104 may be a single material or a combination of materials. In an embodiment, the first electrode 102 and the second electrode 104 may be different materials. In an embodiment, the first and second electrodes 102-104 are silicon. The electrodes 102-104 may be any material suitable for deposition of an electron emission material. The material of the electrodes 102-104 may be but is not limited to SiGe, SiC, GaAs, silicides, or other metals and alloys such as TiW, TiN. In some embodiments, the first electrode 102 is an emission electrode. In some embodiments, the second electrode 104 is an emission electrode. In some embodiments, the first electrode 104 and the second electrode 104 are both emission electrodes.

In the illustrated embodiment, the first electrode 102 and the second electrode 104 are separated by an insulating material 108 or dielectric material. In the illustrated embodiment, the surfaces of the first silicon electrode 102 and the second silicon electrode 104 are planar. In some embodiments, the surfaces of the silicon electrodes 102-104 are etched. Etching removes any oxide, for example silicon oxide, that may have formed on the surface of the electrodes 102-104. In some embodiments, no oxide remains on the surface of the each electrode 102-104. In some embodiments, only one of the electrodes 102-104 is etched to remove oxide. In some embodiments, only a portion of the surface of an electrode 102-104 is etched to remove a native oxide.

FIG. 1B depicts one embodiment of the planar field emission diode 100 of FIG. 1A with an electron emission coating 112 on the surface of the first electrode 102 and the second electrode 104. In the illustrated embodiment, a cavity 110 is formed between the first silicon electrode 102 and the second silicon electrode 104 by removing the sacrificial layer 106, as shown in FIG. 1A. In some embodiments, the cavity is a predetermined distance between the first electrode 102 and the second electrode 104.

In the illustrated embodiment, the surfaces of the silicon electrodes 102-104 are coated with an electron emission material 112 by way of an access hole 114. In some embodiments, the electron emission material 112 may be any material that can be selectively deposited and has good electron emission properties. In some embodiments, the material is an electron emission material with a low work function, e.g., below 4 eV. In some embodiments, the electron emission material 112 is palladium. In some embodiments, the electron emission material 112 may be a noble metal. In some embodiments, the electron emission material 112 can be a conductive material, a thin isolating or semiconducting material through which the electrons can easily tunnel, or a nanostructure combination of the before mentioned materials. Depositing the electron emission material 112 after formation of the first and second electrode and after formation of the cavity 110 may eliminate costly and damaging process steps, such as, for example, bonding of separate wafers. The electron emission material 112 may protect the electrodes 102-104 by eliminating or not producing an insulating oxide on the surface of the electrodes 102-104. For example, silicon oxide can severely hinder an electron emission electrode by creating an insulating layer on the electrode. In some embodiments, either electrode 102, 104 or both electrodes 102-104 are etched to remove oxide from the surface(s) of the electrode(s) 102-104.

In some embodiments, the electron emission material 112 is selectively deposited on the first and second electrodes 102-104 at all exposed electrode surfaces. In some embodiments, only a portion of the surface of an electrode 102, 104 is covered with the electron emission material 112. This may be realized by extra mask layers (not shown in FIG. 1A, similar to layer 108) on the electrodes. In some embodiments, clusters of the electron emission material 112 are deposited on the surface of the electrode 102-104. In some embodiments, the electron emission material 112 is deposited with selective electroless deposition on the surface of at least one of the silicon electrodes. Electroless deposition does not involve an external supply of electrons. Electroless deposition uses a chemical reducing agent for metal deposition at a surface. The electrode itself can also be the reducing agent.

In some embodiments, the electron emission material 112 is selectively coated by electrolytic deposition after formation of the cavity 110. Electrolytic deposition differs from electroless deposition as it involves an external supply of electrons for metal reduction at the surface. In some embodiments, the surface of the first and second electrodes 102-104 is modified by forming a thin alloy on the surface of the first and second electrodes 102-104. In some embodiments, the surface of the first and second electrodes 102-104 is modified by forming metal clusters on the surface of the first and second electrodes 102-104. Other deposition techniques are contemplated including but not limited to vapor deposition techniques. In some embodiments, the deposition of the electron emission material 112 may occur by chemical vapor deposition.

In the illustrated embodiment, the surfaces of the silicon electrodes 102-104 are coated with an electron emission material 112 by way of an access hole 114. In various embodiments, the shape, size, number, and location of the access hole 114 may vary. In some embodiments, the access hole 114 is located remotely from the location of electron emission on the first and second electrodes. In some embodiments, the access hole 114 is isolated from a surface location of electron emission on either or both the first and second electrodes 102-104. The access hole 114 provides access to the surfaces of the first and second electrodes 102-104 for deposition of materials. In some embodiments, the access hole 114 may be a circular hole in the second electrode 104. The access hole 114 may be any shape and other shapes of the access hole 114 are envisioned. In some embodiments, more than one access hole 114 provides access to the cavity 110 to deposit the electron emission material 112 on the surfaces of the first and/or second electrodes 102-104.

In some embodiments, the access hole 114 is plugged after deposition of the electron emission material 112, for example with an aluminum metal layer including an adhesion layer. The plugging of the access hole 114 may occur by sputtering or other compatible techniques. In some embodiments, the cavity 110 separating the first and second electrodes 102-104 is a predetermined distance. In some embodiments, the cavity 110 is hermetically sealed. In some embodiments, the cavity 110 is a vacuum or quasi-vacuum. In some embodiments, the cavity 110 includes a gas or other similar substance. In some embodiments, the cavity 110 is sealed by plugging the access hole 114 after depositing the electron emission material 112. In some embodiments, the plugging the access hole 114 forms a low pressure seal of the cavity 110.

In some embodiments, the field emission diode 100 is part of an electrostatic discharge protection device. In some embodiments, the field emission diode 100 is part of an electrostatic discharge protection device of a wafer-level packaged device.

Figure 2A:
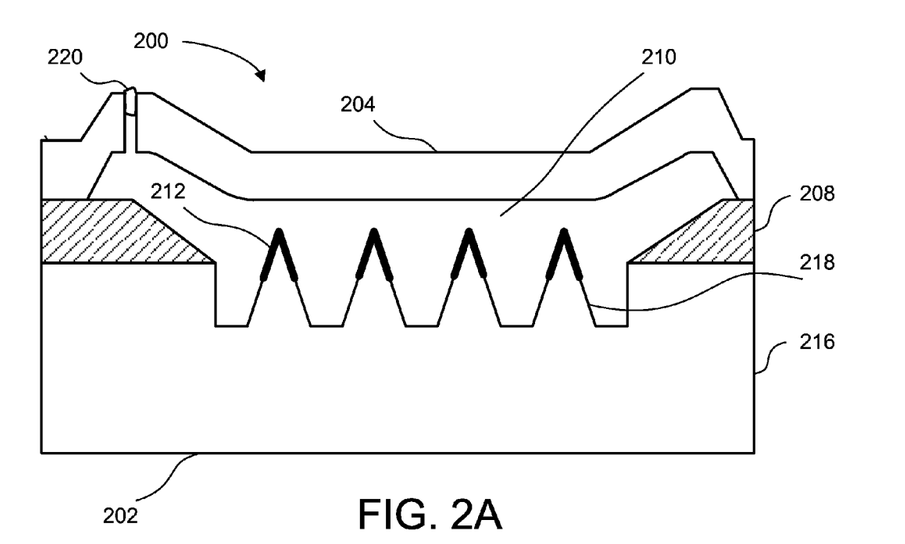
FIG. 2A depicts another embodiment of a field emission diode with field enhancement structures.

FIG. 2A depicts another embodiment of a field emission diode 200 with field enhancement structures 218. Although the field emission diode 200 is shown and described with certain components and functionality, other embodiments of the field emission diode 200 may include fewer or more components to implement less or more functionality.

The illustrated embodiment includes a first electrode 202 and a second electrode 204. The first and second electrodes 202-204 may be a single material or a combination of materials. In an embodiment, the first and second electrodes 202-204 may be different materials. In an embodiment, the first and second electrodes 202-204 are silicon. The electrodes 202-204 may any material suitable for deposition of an electron emission material 212. The electrode material may be but is not limited to SiGe, SiC, GaAs, silicides, alloys, metals, or other materials. In some embodiments, the first electrode 202 is an emission electrode. In some embodiments, the second electrode 204 is an emission electrode. In some embodiments, the first and second electrodes 202-204 are both emission electrodes.

The illustrated embodiment includes forming a cavity 210 between the first silicon electrode 202 and the second electrode 204. The cavity 210 is formed between the first electrode 202 and the second electrode 204 by processes including removing as sacrificial layer. In some embodiments, the cavity 210 is a predetermined distance between the first electrode 202 and the second electrode 204 measured from the closest points, i.e., the tips of the field enhancement structures 218. In some embodiments, the first electrode 202 and the second electrode 204 are separated by a dielectric layer or insulating material 208. In some embodiments, after deposition of the electron emission material 212 and plugging of the access hole, the cavity 210 is a vacuum or a quasi-vacuum. In some embodiments, a gas is included in the cavity 210. In the illustrated embodiment, the access hole is plugged by sputtered aluminum 220.

In the illustrated embodiment, the surface of the second electrode 204 is planar and the surface of the first electrode 202 includes a base portion 216 and field enhancement structures 218. In some embodiments, one electrode 202 is planar and the other includes field enhancement structures 218. In some embodiments, field enhancement structures 218 are included on both electrodes 202-204. In the illustrated embodiment, the field enhancement structures 218 of the electrode are wedges. The field enhancements structures 218 may be of various shapes and sizes. In some embodiments, the field enhancement structures 218 of the electrode are triangular teeth. In some embodiments, the field enhancement structures 218 are pyramidal tips. In some embodiments, the field enhancement structures 218 are conical in shape. Other shapes are envisioned and may be used.

In some embodiments, the surfaces of the electrodes 202-204 are etched. Etching may remove any oxide that may have formed on the surface of the electrodes 202-204. For example, with silicon electrodes, etching may remove any silicon dioxide that may have formed on the surface of the silicon electrodes. In some embodiments, no oxide remains on the surface of the each electrode 202-204. In some embodiments, only one of the electrodes 202-204 is etched to remove oxide.

In some embodiments, the surfaces of the electrodes 202-204 are coated with a material 212 after formation of the electrodes 202-204 and cavity 210. In some embodiments, the electron emission material 212 is a conductive material with a low work function, e.g., below 4 eV. In some embodiments, the electron emission material 212 is palladium. In some embodiments, the entire surfaces of the electrodes 202-204 are coated with an electron emission material 212. In some embodiments, only the field enhancement structures 218 are coated with the electron emission material 212. In some embodiments, only a portion of the field enhancement structures 218 are coated with the electron emission material 212. In the illustrated embodiment, the tips of the field enhancement structures 218 are coated with the electron emission material 212.

In some embodiments, the electron emission material 212 is selectively deposited on the electrodes 202-204. In some embodiments, only a portion of the surface of an electrode 202-204 is covered with the electron emission material 212. In some embodiments, the electron emission material 212 is deposited with selective electroless deposition on the surface of at least one of the electrodes 202-204. In some embodiments, the electron emission material 212 is selectively coated by electrolytic deposition after formation of the cavity 210. In some embodiments, the surface of the electrodes is modified by forming a thin alloy on the surface of the electrodes 202-204.

Figure 2B:
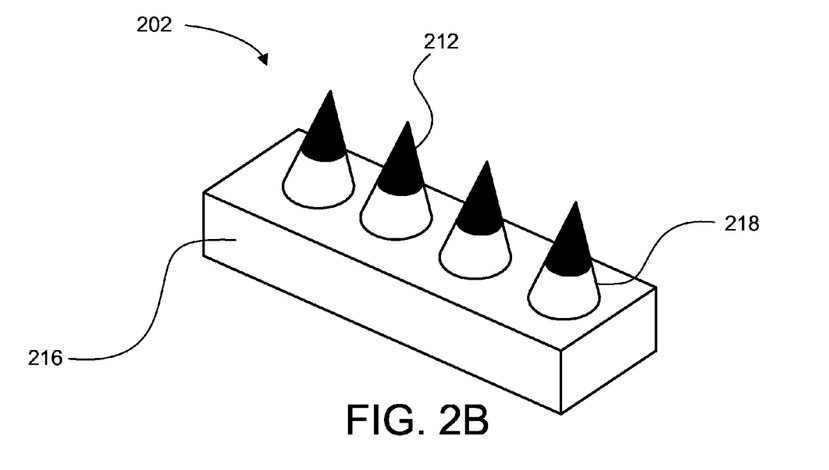
FIG. 2B depicts an embodiment of a portion of an electrode similar to the electrode of FIG. 2A showing a perspective view of the field enhancement structures with selective coating of the tips.

FIG. 2B depicts an embodiment of a portion of an electrode 202 similar to the electrode 202 of FIG. 2A showing a perspective view of the electrode 202 and field enhancement structures 218. In the illustrated embodiment, the electrode 202 includes a base portion 216 and field enhancement structures 218. In the illustrated embodiment, the field enhancement structures 218 of the electrode 202 are conical in shape. The field enhancements structures 218 may be of various shapes and sizes. In some embodiments, the field enhancement structures 218 are triangular teeth, wedges, or other shapes. In the illustrated embodiment, the tips of the field enhancement structures 218 are coated with the electron emission material 212. In some embodiments, the entire surface of the electrode 202 is coated with an electron emission material 212. In some embodiments, a majority of the field enhancement structures 218 are coated with the electron emission material 212. In some embodiments, only a portion of the field enhancement structures 218 are coated with the electron emission material 212.

Figure 3A:
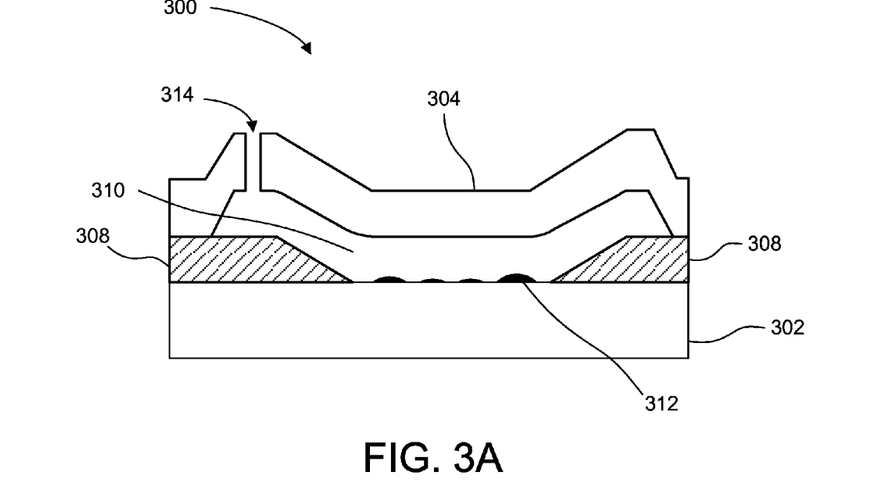
FIG. 3A depicts an embodiment of a field emission diode with selective coating of the surface of the electrodes, where the surfaces are only partially covered.

FIG. 3A depicts an embodiment of a field emission diode 300 with selective coating of the surface of the electrodes 302-304, where the surfaces are only partially covered with an electron emission material 312. Although the field emission diode 300 is shown and described with certain components and functionality, other embodiments of the field emission diode 300 may include fewer or more components to implement less or more functionality.

The illustrated embodiment includes a first electrode 302 and a second electrode 304. The illustrated embodiment includes a cavity 310 between the first electrode 302 and the second electrode 304. The cavity 310 is formed between the first electrode 302 and the second electrode 304 by removing a sacrificial layer. In some embodiments, the cavity 310 is a predetermined distance between the first electrode 302 and the second electrode 304. In some embodiments, the first electrode 302 and the second electrode 304 are separated by a dielectric material or insulating material 308. In some embodiments, the cavity 310 is a vacuum or a quasi-vacuum after deposition of the electron emission material and the plugging of the access hole 314. In some embodiments, a gas is included in the cavity 310.

In the illustrated embodiment, the surfaces of the location of electron emission of the first electrode 302 and the second electrode 304 are planar. In some embodiments, the surfaces of the electrodes 302-304 are etched. Etching may remove any oxide that may have formed on the surface of the electrodes 302-304. In some embodiments, no oxide remains on the surface of the each electrode 302-304.

In some embodiments, the surfaces of the electrodes 302-304 are coated with an electron emission material 312. In some embodiments, the electron emission material 312 is a conductive material with a low work function. In some embodiments, the electron emission material 312 is selectively deposited on the electrodes 302-304. In some embodiments, only a portion of the surface of an electrode 302-304 is covered with the electron emission material 312. In the illustrated embodiment, clusters of the electron emission material 312 are deposited on the surface of the electrode 302. In some embodiments, the electron emission material 312 is deposited with selective electroless deposition on the surface of at least one of the electrodes 302-304.

In some embodiments, the electron emission material 312 is selectively coated by electrolytic deposition after formation of the cavity. In the illustrated embodiment, the silicon surfaces of the electrode 302 is modified by forming metal clusters of the electron emission material 312 on the surface of the electrode 302. In some embodiments, the clusters are formed on both the first electrode 302 and the second electrode 304. The formation of islands or clusters may provide advantages. The electrical field is locally enhanced. The clusters are also isolated from each other. The depositions will not lead to high leakage or extra lateral conduction. The resistance to the emission sites can therefore be accurately controlled by the electrodes 302 or 304. Accidental deposition on insulating layers (308) or non-selective deposition will not lead to electrical leakage.

Figure 3B:
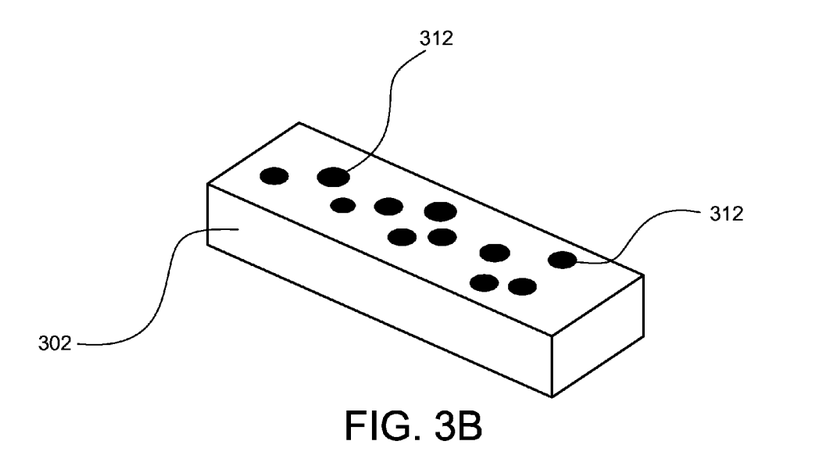
FIG. 3B depicts an embodiment of a portion of an electrode similar to the electrode of FIG. 3A showing a perspective view of the partially covered surface.

FIG. 3B depicts an embodiment of a portion of an electrode 302 similar to the electrode 302 of FIG. 3A showing a perspective view of the electrode 302 and a partially covered surface. In the illustrated embodiment, the electrode 302 is partially covered by metal clusters of the electron emission material 312.

Figure 4A:
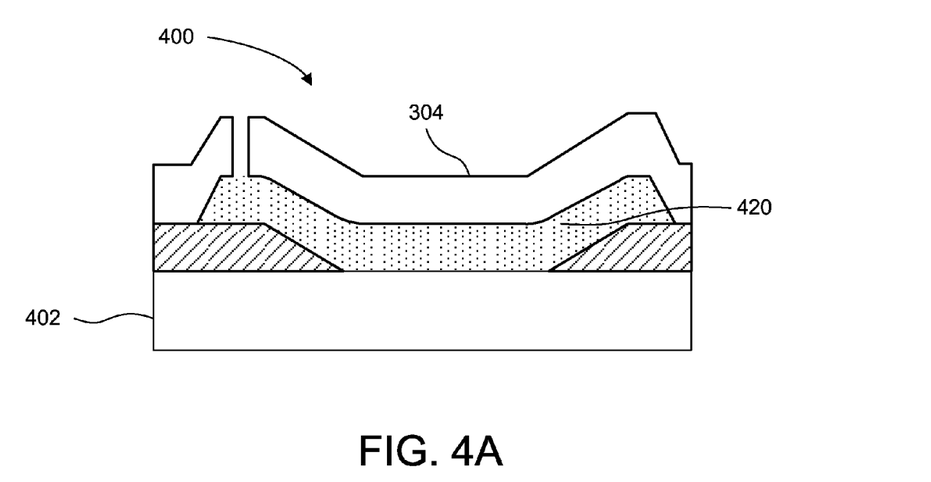
FIG. 4A depicts an embodiment of the etching of a surface of an electrode.

FIG. 4A depicts an embodiment of the etching of the surfaces of electrodes 402-404 of a field emission diode 400. The illustrated embodiment depicts the immersion of the surfaces of electrodes 402-404 of a field emission diode 400 in a diluted HF solution 420. Native oxide may form on the surface of electrodes 402-404. The native oxide is an insulator and may be detrimental in an application such as a field emission diode. For this reason, the surfaces of the electrodes 402-404 are etched to remove any oxide from the surface. The etching of the surface occurs in a cavity (similar to the cavities 110, 210, and 310 shown in FIGS. 1A, 2A, and 3A, respectively). Although the illustrated embodiment describes wet etching, other forms of etching are possible and contemplated. Other processes are envisioned for removing oxide from the surface of an electrode 402.

Figure 4B:
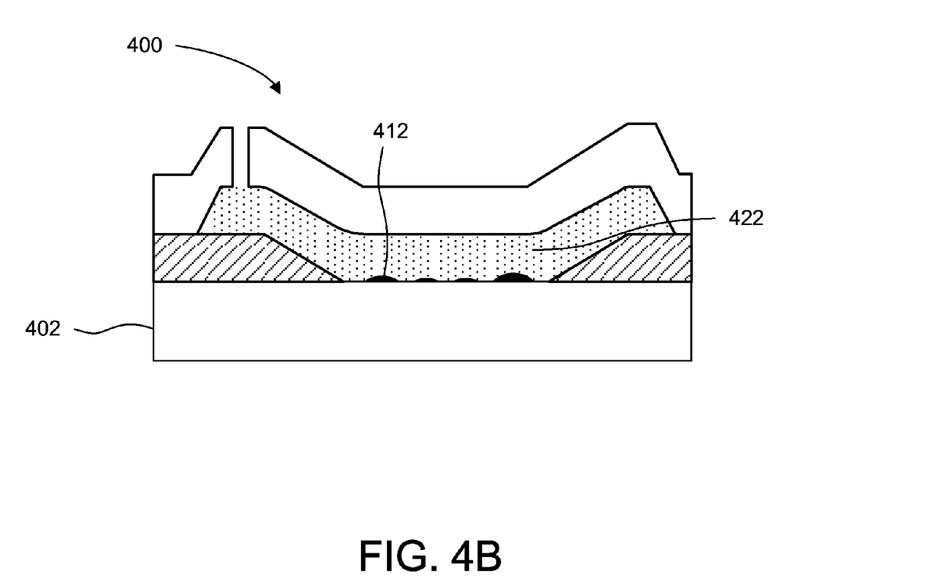
FIG. 4B depicts an embodiment of the coating of the surface of the electrode of FIG. 4A.

FIG. 4B depicts an embodiment of the coating of the surface of the electrodes 402-404 of the field emission diode 400 FIG. 4A. The illustrated embodiment depicts the immersion of the surfaces of the electrodes 402-404 of FIG. 4A in a solution 422 including an electron emission material 412. After etching the surfaces of the electrodes, the surface may be immersed in a solution 422 that includes an electron emission material. In some embodiments, no etching is needed or performed before immersion in a deposition bath such as the solution 422. In an example, a diluted HF solution may contain $PdCl_x$. Electroless deposition in this case is selective. In situations where native oxide still exists on the surface of an electrode 402, palladium will only be deposited on the electrode 402 and not any native silicon oxide on the surface of the electrode 402.

In some embodiments, the electron emission material 412 may be deposited and the surface of the electrode 402 may be dissolved. In some embodiments, the electron emission material 412 would be deposited after rinsing the electrodes 402-404. For example, palladium may be deposited and the silicon at the surface of an electrode may be dissolved. The palladium may be deposited after an HF solution was rinsed. The deposition of the electron emission material 412 occurs within a cavity (similar to the cavities 110, 210, and 310 shown in FIGS. 1, 2A, and 3A, respectively) where the ion exchange with the deposition bath 422 is reduced. This allows for deposition of a limited amount of material or metal 412 on the surface of the electrode 402. The use of palladium as the electron emission material 412 may have advantages, as palladium is used in production for nucleation of plating bases and its oxide has a low electron emission work function.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for forming a field emission diode for an electrostatic discharge device, the method comprising:
    forming a first electrode, a sacrificial layer, and a second electrode, wherein the sacrificial layer separates the first and second electrode;
    forming a cavity between the first and second electrode by removing the sacrificial layer, wherein the cavity separates the first and second electrodes; and
    depositing an electron emission material on a surface of at least one of the first and second electrodes through at least one access hole after formation of the first and second electrodes, wherein the access hole is located remotely from a location of electron emission on the first or second electrodes;
    plugging the access hole after depositing the electron emission material and forming a vacuum or low gas pressure in the cavity, wherein the cavity is hermetically sealed.

2. The method of claim 1, wherein the electron emission material is deposited with selective electroless deposition on the surface of the first and second electrodes.

3. The method of claim 1, further comprising:
    selectively depositing the electron emission material on the first and second electrodes through an access hole, and wherein the electron emission material is palladium.

4. The method of claim 1, wherein the electron emission material is palladium, wherein the palladium is deposited with selective electroless deposition on the surface of at least one of the first and second electrodes.

5. The method of claim 1, wherein at least one of the first or second electrodes is formed with field enhancement structures.

6. The method of claim 1, wherein the electron emission material is deposited with chemical vapor deposition.

7. The method of claim 1, wherein the first electrode is formed with field enhancement structures, wherein depositing an electron emission material on at least one of the first and second electrodes through an access hole comprises coating tips of the field enhancement structures.

8. The method of claim 1, wherein the depositing the electron emission material on the surface of at least one of the first and second electrodes through an access hole comprises selectively coating the first electrode.

9. The method of claim 1, wherein the depositing the electron emission material on the surface of at least one of the first and second electrodes through an access hole comprises only partially covering the surface of one of the first or second electrodes and forming clusters of the electron emission material on the surface of the one of the first or second electrodes.

10. The method of claim 1, further comprising:
    etching a silicon oxide sacrificial layer, wherein etching removes oxide from the surface of the first and second electrode.

11. The method of claim 1, wherein the first electrode is silicon and the second electrode is silicon.

12. A method for selectively coating an electrode in a cavity of a field emission diode, the method comprising:
    depositing an electron emission material into a cavity of a formed field emission diode,
    wherein the electron emission material is deposited on a surface of at least one of a first and second electrode,
    wherein the depositing occurs through an access hole,
    wherein the access hole is located remotely from a location of electron emission on the first and second electrode;
    plugging the access hole after depositing the electron emission material and forming a low pressure vacuum in the cavity, wherein the cavity is hermetically sealed.

13. The method of claim 12, wherein the electron emission material is deposited with selective electroless deposition on the surface of the first and second electrodes.

14. The method of claim 12, wherein the electron emission material is deposited by selectively coating the first electrode by electrolytic deposition.

15. The method of claim 12, wherein the depositing an electron emission material comprises immersing the surfaces of the first and second electrode in a deposition bath comprising a solution comprising palladium.

16. The method of claim 12, wherein the electron emission material is palladium.

17. The method of claim 12, wherein the depositing an electron emission material comprises only partially covering the surface of the first electrode and forming clusters of the electron emission material on the surface of the first electrode.

18. The method of claim 12, wherein the first electrode comprises field enhancement structures, wherein depositing an electron emission material comprises coating tips of the field enhancement structures.

* * * * *